United States Patent
Cox et al.

(10) Patent No.: US 12,080,369 B2
(45) Date of Patent: Sep. 3, 2024

(54) MEMORY DEVICE WITH MODULAR DESIGN AND MEMORY SYSTEM COMPRISING THE SAME

(71) Applicant: MONTAGE ELECTRONICS (SHANGHAI) CO., LTD., Shanghai (CN)

(72) Inventors: Christopher Cox, San Jose, CA (US); Leechung Yiu, San Jose, CA (US); Robert Xi Jin, San Jose, CA (US); Zheng Qiu, Shanghai (CN); Leonard Datus, San Jose, CA (US); Lizhi Jin, San Jose, CA (US)

(73) Assignee: MONTAGE ELECTRONICS (SHANGHAI) CO, Shanghai (CN)

( * ) Notice: Subject to any disclaimer, the term of this patent is extended or adjusted under 35 U.S.C. 154(b) by 293 days.

(21) Appl. No.: 17/577,400

(22) Filed: Jan. 18, 2022

(65) Prior Publication Data

US 2023/0215474 A1  Jul. 6, 2023

(30) Foreign Application Priority Data

Jan. 6, 2022  (CN) .......................... 202210009086.9

(51) Int. Cl.
*H05K 1/02*  (2006.01)
*G06F 1/00*  (2006.01)
(Continued)

(52) U.S. Cl.
CPC ............... *G11C 5/04* (2013.01); *H05K 1/181* (2013.01); *H05K 5/0286* (2013.01)

(58) Field of Classification Search
CPC ........ H05K 1/02; H05K 5/0286; H05K 7/142; H05K 7/1418; H05K 7/1461;
(Continued)

(56) References Cited

U.S. PATENT DOCUMENTS 5,002,498 A * 3/1991 Takahashi ............ H01R 12/721
439/328
5,663,901 A * 9/1997 Wallace ................ G06F 13/385
365/185.11

(Continued)

FOREIGN PATENT DOCUMENTS

CN  101625580 A  1/2010
CN  203179010 U  9/2013

(Continued)

OTHER PUBLICATIONS

Second Office Action of the corresponding Chinese application No. 202210009086.9 mailed on May 20, 2023.

(Continued)

*Primary Examiner* — Xiaoliang Chen
(74) *Attorney, Agent, or Firm* — Jun He Law Offices P.C; James J. Zhu

(57) ABSTRACT

A memory device with modular design and the memory system comprising the same is disclosed. The memory device comprises a substrate plate having a front edge, a rear edge opposite to the front edge, and a top side and a bottom side which are opposite to each other and extend between the front edge and the rear edge; an edge connector positioned at the rear edge and configured to connect to a host connector of a host device; a memory control module positioned on one of the top side and the bottom side of the substrate plate; at least one socket positioned on the top side of the substrate plate and configured to connect to at least one removable memory module; and wherein the memory controller module is electrically coupled to the edge connector (Continued)

and the at least one socket such that the at least one memory module can be accessible by the host device via the memory control module.

21 Claims, 7 Drawing Sheets

(51) Int. Cl.
*G06F 1/10* (2006.01)
*G06F 13/12* (2006.01)
*G11C 5/04* (2006.01)
*H05K 1/18* (2006.01)
*H05K 5/02* (2006.01)

(58) Field of Classification Search
CPC .. H05K 7/1431; H05K 7/20727; H05K 1/141; H05K 1/148; H05K 1/181; G11C 5/04; G06F 1/00; G06F 1/10; G06F 1/183; G06F 1/187; G06F 1/1616; G06F 1/1658; G06F 3/067; G06F 3/0601; G06F 3/0605; G06F 3/0611; G06F 3/0619; G06F 3/0626; G06F 3/0647; G06F 3/0658; G06F 3/0685; G06F 13/12; G06F 13/287; G06F 13/385; G06F 13/426; G06F 13/1657; G06F 13/1642; G06F 13/1684; G06F 13/1694; G06F 13/4022; G06F 13/4068
USPC ....... 361/790, 676, 679.31, 728, 737; 710/5, 710/6, 62, 72, 301, 300, 746; 711/5, 10, 711/103, 120, 115, 153, 158; 439/157
See application file for complete search history.

(56) References Cited

U.S. PATENT DOCUMENTS

| | | | | |
|---|---|---|---|---|
| 5,673,029 A * | 9/1997 | Behl | G11B 33/142 | |
| 5,697,802 A * | 12/1997 | Kawabe | H01R 12/83 | 439/326 |
| 5,833,478 A * | 11/1998 | Tseng | H01R 12/83 | 439/326 |
| 6,234,829 B1 * | 5/2001 | Thomsen | H01R 12/7005 | 439/491 |
| 6,363,450 B1 * | 3/2002 | Lash | G06F 1/188 | 439/59 |
| 6,502,161 B1 * | 12/2002 | Perego | G11C 5/04 | 711/5 |
| 7,352,199 B2 * | 4/2008 | Chhor | G11C 29/48 | 324/750.3 |
| 8,225,006 B1 * | 7/2012 | Karamcheti | G06F 11/108 | 714/6.21 |
| 8,341,300 B1 * | 12/2012 | Karamcheti | G06F 13/1642 | 710/52 |
| 8,429,318 B1 * | 4/2013 | Karamcheti | G06F 13/1657 | 710/62 |
| 8,516,172 B1 * | 8/2013 | Karamcheti | G06F 3/0659 | 710/62 |
| 8,639,863 B1 * | 1/2014 | Kanapathippillai | G06F 13/1684 | 710/62 |
| 8,650,343 B1 * | 2/2014 | Kanapathippillai | G06F 13/1657 | 710/72 |
| 8,677,037 B1 * | 3/2014 | Karamcheti | G06F 13/1642 | 710/62 |
| 8,689,042 B1 * | 4/2014 | Kanapathippillai | G06F 13/1694 | 714/6.22 |
| 8,706,932 B1 * | 4/2014 | Kanapathippillai | G06F 13/1694 | 710/72 |
| 8,949,555 B1 * | 2/2015 | Karamcheti | G06F 13/1657 | 711/158 |
| 9,583,850 B1 * | 2/2017 | Diokno | H01R 13/641 | |
| 10,028,403 B1 * | 7/2018 | Hartman | H05K 7/142 | |
| 10,394,573 B2 * | 8/2019 | Mukadam | G06F 3/0685 | |
| 10,645,835 B1 * | 5/2020 | Sauer | H05K 7/1461 | |
| 2002/0084458 A1 * | 7/2002 | Halbert | G06F 13/4256 | 257/63 |
| 2003/0077925 A1 * | 4/2003 | Cermak, III | G06F 1/184 | 439/74 |
| 2003/0206403 A1 * | 11/2003 | Zaremba | G02B 6/4261 | 361/728 |
| 2004/0017707 A1 * | 1/2004 | Wallace | G06K 7/0047 | 365/200 |
| 2006/0232914 A1 * | 10/2006 | Hori | G06F 1/20 | 361/676 |
| 2007/0002668 A1 * | 1/2007 | Williams | G11C 11/4082 | 365/230.06 |
| 2007/0005836 A1 * | 1/2007 | Jain | G11C 7/04 | 710/62 |
| 2007/0013704 A1 * | 1/2007 | MacWilliams | G06F 13/1684 | 345/542 |
| 2007/0168812 A1 * | 7/2007 | Sutardja | G11C 29/42 | 714/736 |
| 2007/0218741 A1 * | 9/2007 | Langgood | H01R 13/62988 | 439/328 |
| 2008/0082731 A1 * | 4/2008 | Karamcheti | G11C 7/1072 | 711/E12.008 |
| 2008/0082732 A1 * | 4/2008 | Karamcheti | G06F 13/1657 | 711/E12.008 |
| 2008/0082733 A1 * | 4/2008 | Karamcheti | G06F 12/0638 | 711/E12.008 |
| 2008/0082734 A1 * | 4/2008 | Karamcheti | G06F 13/1657 | 711/E12.008 |
| 2008/0082750 A1 * | 4/2008 | Okin | G11C 7/1072 | 711/E12.001 |
| 2008/0082751 A1 * | 4/2008 | Okin | G06F 12/0246 | 711/E12.001 |
| 2008/0082766 A1 * | 4/2008 | Okin | G06F 12/0893 | 711/E12.001 |
| 2009/0080164 A1 * | 3/2009 | Purcell | H05K 1/148 | 361/737 |
| 2009/0210636 A1 * | 8/2009 | Karamcheti | G11C 5/04 | 711/E12.001 |
| 2009/0254689 A1 * | 10/2009 | Karamcheti | G06F 16/2455 | 707/E17.014 |
| 2009/0294249 A1 * | 12/2009 | Schlaich | B23Q 7/1431 | 198/346.1 |
| 2011/0117768 A1 * | 5/2011 | Li | H01R 12/7029 | 439/345 |
| 2011/0320690 A1 * | 12/2011 | Petersen | G06F 3/0611 | 711/E12.019 |
| 2013/0088829 A1 * | 4/2013 | Co | G06F 1/185 | 361/679.31 |
| 2013/0138844 A1 * | 5/2013 | Karamcheti | G06F 13/12 | 710/74 |
| 2013/0309893 A1 * | 11/2013 | Li | H01R 12/721 | 439/328 |
| 2014/0304456 A1 * | 10/2014 | Narasimha | G06F 13/1694 | 711/103 |
| 2014/0304560 A1 * | 10/2014 | Narasimha | G06F 11/076 | 714/704 |
| 2016/0092384 A1 * | 3/2016 | Karamcheti | G06F 13/1673 | 710/300 |
| 2016/0162404 A1 * | 6/2016 | Lee | G11C 7/1093 | 711/120 |
| 2016/0299767 A1 * | 10/2016 | Mukadam | G06F 13/426 | |
| 2016/0306768 A1 * | 10/2016 | Mataya | G11C 16/26 | |
| 2017/0220505 A1 * | 8/2017 | Breakstone | G06F 13/4282 | |
| 2019/0104632 A1 * | 4/2019 | Nelson | H05K 7/20727 | |
| 2019/0131741 A1 * | 5/2019 | Pav | G06F 1/00 | |
| 2020/0006905 A1 * | 1/2020 | Torres | H01R 31/065 | |
| 2021/0135460 A1 * | 5/2021 | Zhai | H02J 7/007192 | |
| 2022/0021139 A1 * | 1/2022 | Li | H01R 12/737 | |

(56) References Cited

U.S. PATENT DOCUMENTS

| | | | |
|---|---|---|---|
| 2022/0238159 A1* | 7/2022 | Bronner | G11C 16/06 |
| 2023/0028263 A1* | 1/2023 | Ma | G06F 1/1658 |
| 2023/0161393 A1* | 5/2023 | Riepling | G06F 1/206 |
| | | | 700/300 |

FOREIGN PATENT DOCUMENTS

| | | |
|---|---|---|
| CN | 104756617 A | 7/2015 |
| EP | 0606111 A2 | 7/1994 |

OTHER PUBLICATIONS

The first office action of the corresponding Chinese application 202210009086.9, mailed on Mar. 12, 2023.

* cited by examiner

MEMORY DEVICE WITH MODULAR DESIGN AND MEMORY SYSTEM COMPRISING THE SAME

TECHNICAL FIELD

The application generally relates to memory technology, and particularly to a memory device with a modular design and a memory system that comprises the same.

BACKGROUND

Solid-state drives (SSDs) are commonly used in client, hyperscale and enterprise compute environments, which can be built in many different form factors. Enterprise and Data Center Standard Form Factor (EDSFF) E3 is a family of form factors designed to update and replace the traditional U.2 2.5-inch form factor in servers and storage systems, and is intended for use in enclosures that fit within either a 1 U or a 2 U space (e.g., 1 U refers to 1 standard unit of an IT equipment rack and the IT enclosures that fit in this space). All versions of the E3 family should be slot/connector compatible and are designed to be front accessible. A card edge connector as defined in SFF-TA-1002 can be used to electrically connect the E3 device to a storage system.

However, there is a need for further improvement to the existing memory devices.

SUMMARY

An objective of the present application is to provide a memory device with a modular design and a memory system that comprises the same.

In an aspect of the present application, there is provided a memory device. The memory device includes a substrate plate having a front edge, a rear edge opposite to the front edge, and a top side and a bottom side which are opposite to each other and extend between the front edge and the rear edge; an edge connector positioned at the rear edge and configured to connect to a host connector of a host device; a memory control module positioned on one of the top side and the bottom side of the substrate plate; at least one socket positioned on the top side of the substrate plate and configured to allow memory modules to be removable, and wherein the memory control module is electrically coupled to the edge connector and the at least one socket such that the at least one memory module can be accessible by the host device via the memory control module.

In an embodiment, the memory control module is positioned on the bottom side of the substrate plate.

In an embodiment, the at least one socket comprises two sockets.

In an embodiment, the memory device further comprises: a first anchor for securing a first socket of the two sockets to the top side of the substrate plate; and a second anchor for securing a second socket of the two sockets to the top side of the substrate plate.

In an embodiment, the first socket is closer to the top side of the substrate plate relative to the second socket.

In an embodiment, the second socket is closer to a periphery of the substrate plate relative to the first socket.

In an embodiment, the first anchor and the second anchor are offset from each other in a planar direction of the top side of the substrate plate.

In an embodiment, the memory device further comprises at least one retention clip for engaging with respective edges of the at least one memory module when they are connected to the at least one socket.

In an embodiment, the first anchor is adjacent to the second anchor such that the first socket connects to a first memory module of the at least one memory module in a first direction and the second socket connects to a second memory module of the at least one memory module in a second direction opposite to the first direction.

In an embodiment, the first anchor and the second anchor are positioned at a center of the top side of the substrate plate.

In an embodiment, the memory control module is positioned on the top side of the substrate plate.

In an embodiment, the memory control module is positioned between the edge connector and the at least one socket.

In an embodiment, the memory device further comprises: a first anchor for securing a first socket of the at least one socket to the top side of the substrate plate; and a second anchor for securing a second socket of the at least one socket to the top side of the substrate plate.

In an embodiment, the first anchor is adjacent to the second anchor such that the first socket connects to a first memory module of the at least one memory module in a first direction and the second socket connects to a second memory module of the at least one memory module in a second direction opposite to the first direction.

In an embodiment, the memory device further comprises: a first anchor stack for securing a first socket and a second socket of the at least one socket to the top side of the substrate plate; and a second anchor stack for securing a third socket and a fourth socket of the at least one socket to the top side of the substrate plate.

In an embodiment, the first anchor stack is adjacent to the second anchor stack such that the first and second sockets connect to a first memory module and a second memory module of the at least one memory module in a first direction and the third and fourth sockets connect to a third memory module and a fourth memory module of the at least one memory module in a second direction opposite to the first direction.

In an embodiment, the first and third memory modules are closer to the top side of the substrate plate relative to the second and fourth memory modules when they are connected to the respective sockets.

In an embodiment, the first anchor stack and the second anchor stack are integrally formed as a single piece.

In an embodiment, the at least one memory module comprises at least one small outline dual inline memory module (SODIMM).

In an embodiment, the edge connector is in compliance with the SFF-TA-1002 standard.

In an embodiment, the memory device further comprises a chassis for enclosing the substrate plate, the memory control module and the at least one socket, wherein the chassis comprises an opening through which the edge connector protrudes out of the chassis.

In an embodiment, the chassis comprises an air vent at a front edge of the chassis and is configured to build an air flow across the chassis from the opening to the air vent.

In another aspect of the present application, there is provided a memory system. The memory system includes a substrate plate having a front edge, a rear edge opposite to the front edge, and a top side and a bottom side which are opposite to each other and extend between the front edge and the rear edge; an edge connector positioned at the front edge and configured to connect to a host connector of a host device; a memory control module positioned on one of the top side and the bottom side of the substrate plate; at least one socket positioned on the top side of the substrate plate; at least one removable memory module connected to the at least one socket, respectively; and wherein the control module is electrically coupled to the edge connector and the at least one socket such that the at least one memory module can be accessible by the host device via the memory control module.

The foregoing is an overview of the present application, which may simplify, summarize, and omit details. Those skilled in the art will appreciate that this section is merely illustrative and not intended to limit the scope of the present application in any way. This summary section is neither intended to identify key features or essential features of the claimed subject matter nor intended to act as an auxiliary means for determining the scope of the claimed subject matter.

BRIEF DESCRIPTION OF THE DRAWINGS

The foregoing and other features of the present application will be more fully understood from the following description and the appended claims taken in conjunction with the accompanying drawings. It is to be understood that these drawings depict only a few embodiments of the contents of the present application and should not be construed as limiting the scope of the present application. The contents of the present application will be illustrated more clearly and in more detail with the accompanying drawings.

DETAILED DESCRIPTION OF THE EMBODIMENTS

Figure 1:
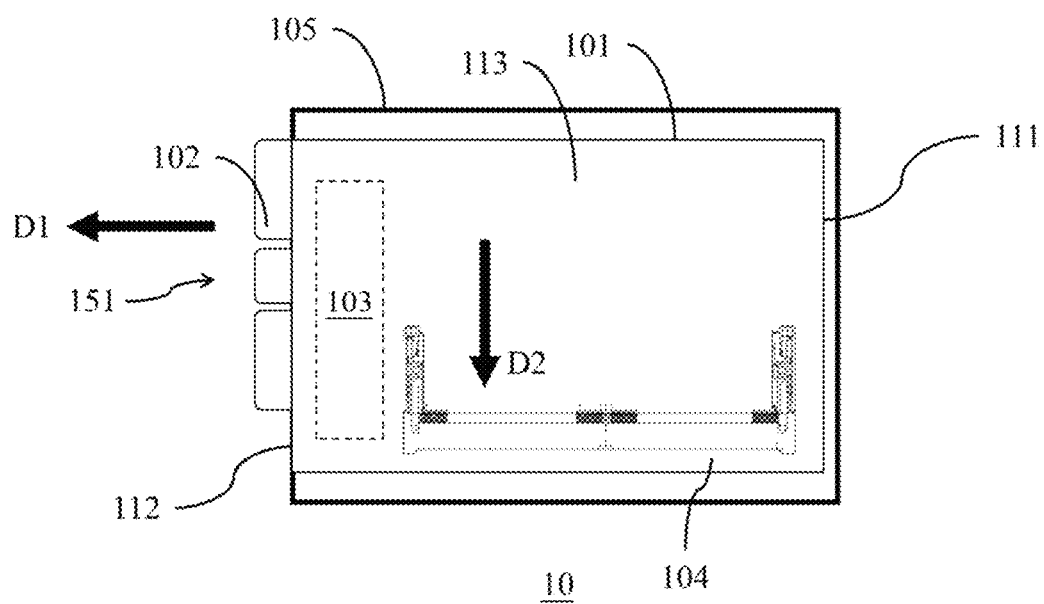
FIG. 1 shows a memory device 10 with a modular design according to an embodiment of the present application.

In the following detailed description, reference is made to the accompanying drawings which form a part hereof. In the drawings, similar reference numerals generally refer to similar parts unless the context clearly dictates otherwise. The illustrative embodiments described in the detailed description, drawings, and claims are not intended to be limiting. Other embodiments may be employed, and other changes may be made without departing from the spirit or scope of the subject matter of the present application. It is to be understood that various configurations, substitutions, combinations, and designs of the various forms of the present application, which are generally described in this application and are illustrated in the drawings, are intended to constitute a part of the present application.

Throughout the context of this application, "layer" means a spatial level within which the components can be arranged. When some of the components are arranged in one layer, it means that these components are generally at the same height with reference to a substrate plate. As will be detailed below, there may be up to two layers for arranging the components above the substrate plate and one layer below the substrate plate when fulfilling some industrial standards. However, more layers of components can be provided if more space is available inside the memory device according to certain embodiments of the present application.

Figure 2:
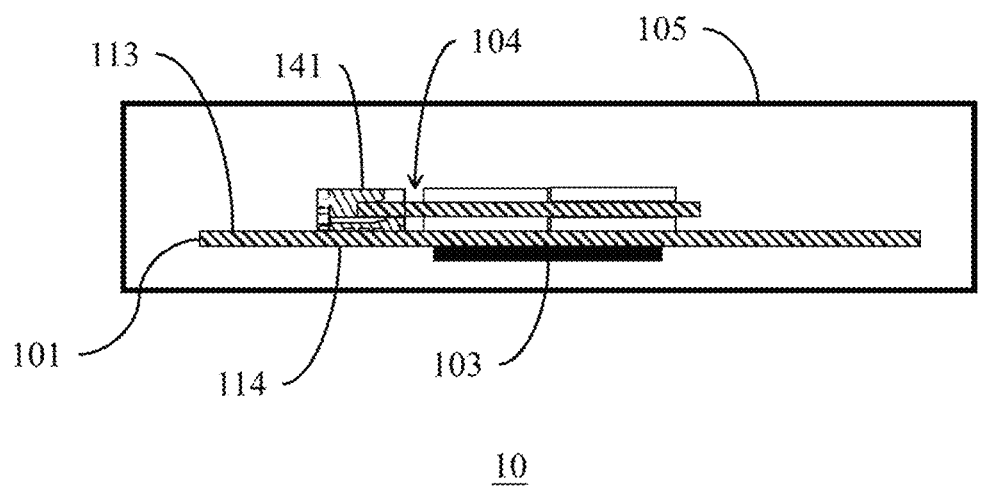
FIG. 2 shows a right view of the memory device 10 of FIG. 1.

FIG. 1 shows a memory device 10 with a modular design according to an embodiment of the present application. The memory device 10 shown in FIG. 1 includes a substrate plate 101 with a front edge 111 and a rear edge 112 opposite to the front edge 111. FIG. 2 shows a side view of the memory device 10 of FIG. 1. The top side 113 and a bottom side 114 extend between the front edge 111 and the rear edge 112, which can form one or two surfaces for mounting chips, electrical components and any other suitable components of the memory device 10. The chips, electrical components or other functionalities can be attached to the top side 113 and/or the bottom side 114 by any well-known processes such as welding, screwing, etc. with or without electrical connectivity to other components of the memory device 10.

Figure 10:
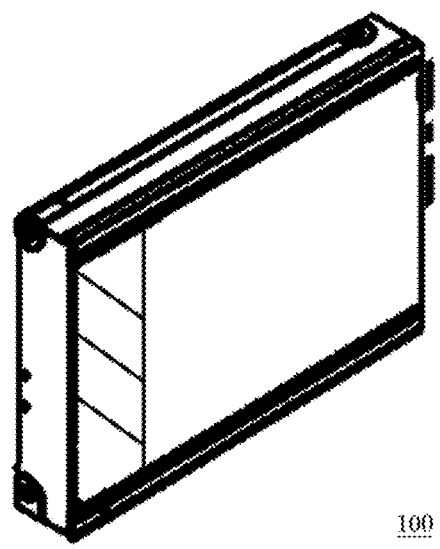
FIG. 10 shows a memory device 100 in a complete form according to an embodiment of the present application.

As illustrated in FIG. 2, although not compulsory, the substrate plate 101 may form two mounting surfaces at the top and bottom sides 113 and 114, respectively. In some embodiments, the substrate plate 101 and other electrical components or functionalities mounted thereto can be enclosed by a chassis 105, so as to form a compact profile as a memory device 100 shown in FIG. 10. As will be detailed below, the electrical components and functionalities can be one or more memory control module, one or more socket and etc.

Still referring to FIG. 1, the memory device 10 also includes an edge connector 102. The edge connector 102 is positioned at the rear edge 112 of the substrate plate 101, and is configured for connecting to an external device such as a host device (not shown for simplicity) via a host connector of the host device. In some embodiments, the edge connector 102 can be in form of single-sided or double-sided "golden fingers" (i.e. contacts) that is known in the industry. In an embodiment, the edge connector 102 can be compatible with the SFF-TA-1002 standard. The SFF-TA-1002 standard defines an unshielded, input/output, card edge connector and mating card interface which is configurable for straight, right angle, straddle mount, and orthogonal applications. The SFF-TA-1002 standard and some other relevant SFF standards including the SFF-TA-1006, SFF-TA-1008, SFF-TA-1009 standards can be found at the SNIA official website (www.snia.org/technology-communities/sff/specifications), the entire contents of which are incorporated herein by reference. Being compatible with the existing edge connector standards, the memory devices according to the embodiments of the present application can be directly connected to existing devices, for example, the host devices that have SFF-TA-1002 ports. The host device described herein may be a computer or a smart device that may need additional memory devices for data storage purposes.

Continue to refer to FIG. 2, when enclosed by the chassis 105, the substrate plate 101 (as well as the edge connector 102 at its rear edge 112) can be located near a lower side of the chassis 105 according to the spatial requirement of some industrial standards. As such, more space may be available above the top side 113 than below the bottom side 114. In some circumstances, two layers of components can be positioned above the top side 113 while less components may be mounted onto the bottom side 114. Moreover, the chassis 105 has an opening 151 with respect to the location of the edge connector 102. The edge connector 102 can protrude out of the chassis 105 through the opening 151 for coupling to an external host device.

The memory device 10 shown in FIG. 1 also includes a memory control module 103 positioned on the bottom side 114 of the substrate plate 101. However, in other embodiments, the memory control module 103 can be positioned on either of the top side 113 and the bottom side 114 of the substrate plate 101 provided that it does not conflict with the other components mounted on the substrate plate 101. It can be appreciated that the memory control module 103 may include an integrated circuit chip and optionally one or more other electrical components. In some examples, the number of layers of components positioned within the chassis 105 can be up to three. Compared with the solution with both the memory control module 103 and the other components (e.g., the sockets to be described below) positioned on the top side 113, the arrangement that the memory control module 103 is positioned on the bottom side 114 while the other components are positioned on the top side 113 may leave less room for mounting components on the top side 113 as the height of the memory device 10 is restricted, e.g., by the internal space defined by the chassis 105. On the other hand, heat dissipation for the components of the memory device 10 may be better.

The memory device 10 shown in FIG. 1 also includes at least one socket positioned on the top side 113 of the substrate plate 101. As shown in FIG. 1, a socket 104 is positioned on the top side 113 such that a memory module (not shown) can be removably connected to the socket 104. In other examples, there could be more than one socket positioned on the top side 113. As shown in FIGS. 1 and 2, the memory control module 103 is electrically coupled to the bottom side 114 of the substrate plate 101 with the edge connector 102, with the socket 104 on the top side 113 of the substrate plate 101, in some examples, so that the memory module can be accessible by the host device via the memory control module 103, for example, to read data from and write data into the memory module. In other embodiments, there can be more than one socket positioned on the top side 113, hence providing more room for accommodating more memory modules. As will be further described below, the sockets can be stacked or slightly staggered from each other.

As shown in FIG. 2, the memory device 10 is further equipped with an anchor 141 for securing the socket 104 onto the top side 113 of the substrate plate 101. In some examples, the anchor 141 may further include built-in wires, cables or any other suitable connection features that electrically connect the socket 104 with the circuits on the substrate 101, or in particular, the memory control module 103. In some other embodiments, additional electrical connection features such flexible cables or a flexible card may be used for electrically connecting the components positioned on two separate regions of the memory device 10. Although separately described, the anchor(s) and the socket(s) may share or be manufactured as a single piece while each plays the role as mentioned herein.

Figure 3:
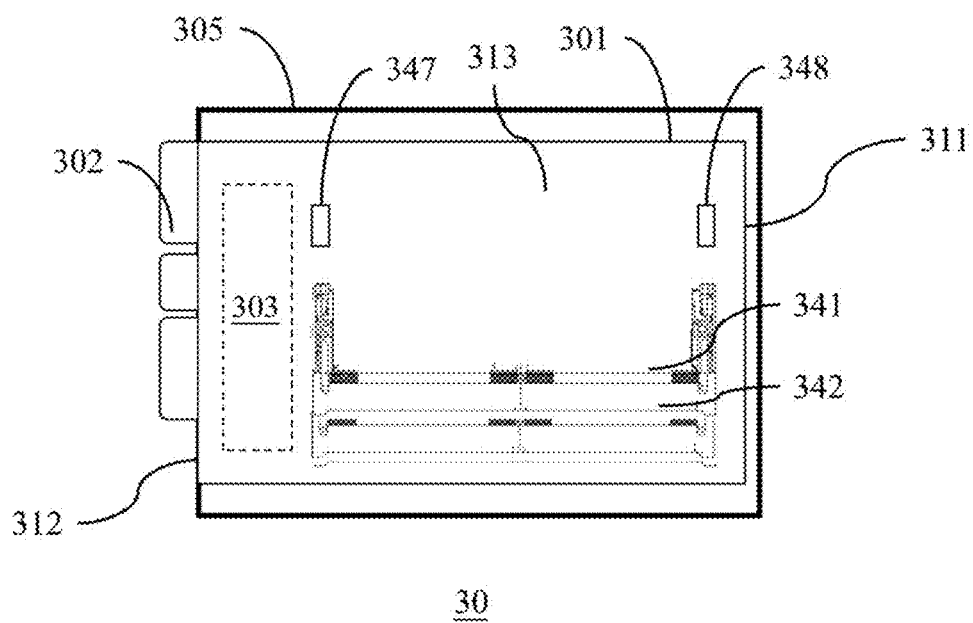
FIG. 3 shows a memory device 30 with a modular design according to an embodiment of the present application.
Figure 4:
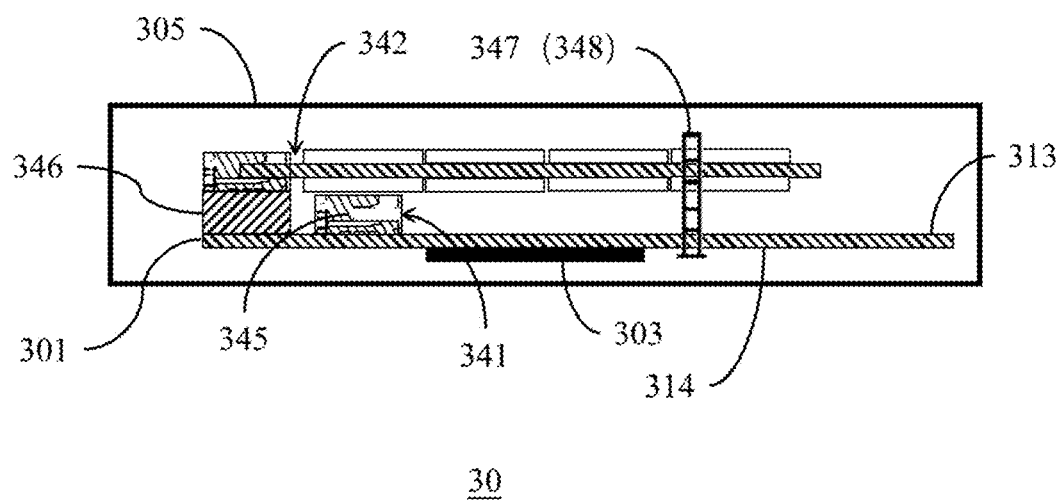
FIG. 4 shows a right view of the memory device 30 of FIG. 3.

FIG. 3 and FIG. 4 collaboratively show a memory device 30 with a modular design according to an embodiment of the present application. The memory device 30 includes a substrate plate 301 with a front edge 311, a rear edge 312, a top side 313, and a bottom side 314, which are similar to those components described with reference to FIGS. 1 and 2 and will therefore not be elaborated below. In some embodiments, the substrate plate 301 and other electronic components or electronic functionalities mounted thereto can be partially enclosed by a chassis 305. An edge connector 302 of the memory device 30 can be positioned at the rear edge 312 of the substrate plate 301 for an external host device to be connected.

The memory device 30 includes a memory control module 303, which is positioned on the bottom side 314 of the substrate plate 301. The arrangement of the memory control module 303 on the bottom side 314 can be optionally determined for avoiding the conflict with sockets to be mounted on the top side 313, as elaborated below.

Compared with the memory device 10 with a single socket shown in FIGS. 1 and 2, the memory device 30 may have two sockets 341 and 342 which can accordingly double the number of memory modules connectable with the memory device 10, whether these memory modules are standard memory modules (e.g., industrial standard DDR SODIMM module) or double-heightened memory modules (e.g., newly design DDR SODIMM module with double height). In some example, when the memory device is enclosed by an EDSFF E3 chassis, the inner place of the memory device can be 102.123 mm*76.00 mm*16.81 mm in size according to the EDSFF E3 specification. As two memory modules and one substrate plate are stacked together, the total height is about 16.77 mm, which is smaller than a height (16.81 mm) of the EDSFF E3 chassis. In addition, the EDSFF E3 specification provides a maximum width of 76.00 mm, so the widest memory module can be accommodated therein is about 55 mm after deducting the space occupied by some other components, e.g., the sockets, anchors, etc., which is still sufficient for receiving a double-heightened memory module. It should be noted that although in the above example it is merely described that SODIMM modules can be seated within the sockets in the memory device, this application is not limited thereto, and any other types of memory module can be seated within the sockets provided that mating sockets are mounted in the memory device.

The memory device 30 further includes a first anchor 345 and a second anchor 346 for securing the first socket 341 and the second socket 342 to the top side 313 of the substrate plate 301 respectively. The second socket 342 may be higher than the first socket 341 relative to the surface of the top side 313, thus the two memory modules seated within the sockets 341 and 342 can be arranged in a compact manner, saving footprint on the substrate plate 301. In some embodiments, the two sockets 341 and 342 can be slightly staggered from each other. For example, the second socket 342 can be closer to a periphery (e.g., a nearest side) of the substrate plate 301 relative to the first socket 341, as shown in FIG. 4. In some examples, the first anchor 345 and the second anchor 346 can be offset from each other in a planar direction of the top side 313, i.e., they are attached onto two distinct but adjacent positions on the top side 313. By this configuration, a memory module can be more easily inserted into and latched by the lower socket 341, because a slight pivotal movement of the memory module seated within the second socket 342 about the anchor 346 can allow for a significant space for insertion of the memory module into the first socket 341.

Figure 11:
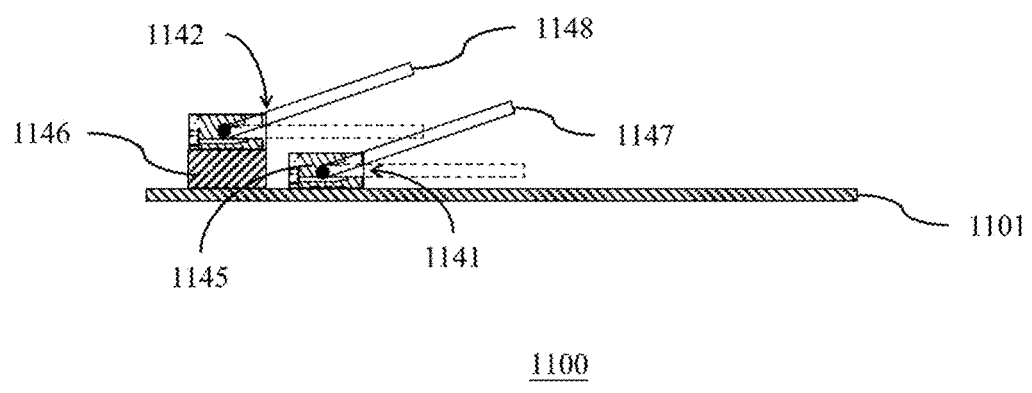
FIG. 11 shows an accommodating mechanism 1100 according to an embodiment of the present application.

FIG. 11 shows an accommodating mechanism 1100 according to an embodiment of the present application. As shown in FIG. 11, an upper socket 1142 and a lower socket 1141 are secured by a first anchor 1146 and a second anchor 1145 to the top side of the substrate plate, respectively. When no memory module is received within a socket, a locking rod or cover 1147 (or 1148) can be lifted a bit and angled from the substrate plate 1101, so as for a memory module to be inserted. When a socket is in use by receiving a memory module therein, the locking rods or covers 1147, 1148 can be pressed or rotated downward to a position substantially in parallel with the substrate plate (shown as dotted lines).

Referring backing to FIGS. 3 and 4, as illustrated above, the memory modules to be accommodated within the sockets can be either standard or double-heightened memory modules. With standard memory modules, the sockets themselves may provide enough mechanical force for latching the memory modules steadily. With the double-heightened memory modules, the sockets may be not able to fasten them in a secure state. The wobble of the double-heightened memory modules in the height direction may occur during use. To mitigate this problem, the memory device 30 may further have retention clips 347 and 348. The retention clips 347 and 348 can engage with respective edges of memory modules when they are connected to the sockets. For example, the retention clip 347 can be engaged with a free end or edge of the memory module seated within the second socket 342. Since the other end or edge of the memory module(s) is inserted into the corresponding socket, the memory module can be firmly seated within the socket. The skilled person will understand that the number and form of the retention clip(s) can be designed with respect to the requirements.

Figure 12:
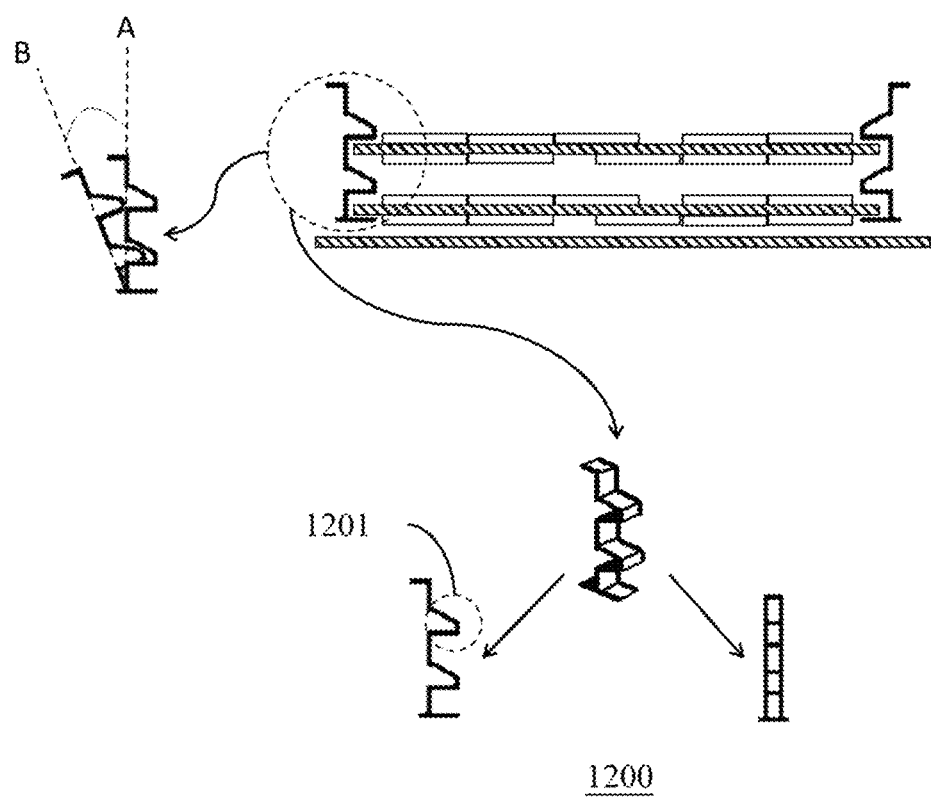
FIG. 12 shows a retention clip 1200 according to an embodiment of the present application.

The retention clips 347 and 348 can be used in various embodiments of the present application and may not interfere with the standard SODIMM modules or other types of memory modules seated. In some examples, the retention clips 347 and 348 can be used to cap the memory modules, for example, with twice the length than standard ones. FIG. 12 shows a retention clip 1200 according to an embodiment of the present application. The retention clip 1200 may support different types of memory modules when they are in paired use. The retention clip 1200 can be constructed out of high temperature from flexible plastic or metal with enough elastic properties to allow for thousands of insertions which would flex the body of the retention clip 1200 (marked as the state B) at least 25 degrees away from its upright position (marked as the state A). The flange 1201 of the retention clip 1200 would keep each of the memory modules securely in place when inserted and may be at least 4 mm wide, for example.

As shown in FIG. 1, the memory device may be connected to an external host device in an inserted direction D1 which is generally aligned with a lengthwise direction of the substrate plate 101, while the memory modules may be inserted into the memory device in an accommodating direction D2 which is generally aligned with a widthwise direction of the substrate plate 101. Since the pins or contacts of a memory module are generally positioned at its longer edge, and thus the lengthwise direction of the memory module can be in parallel with the lengthwise direction of the memory device when the memory module is received within and latched by a socket of the memory device, hence longer memory modules can be seated within the memory device.

Figure 5:
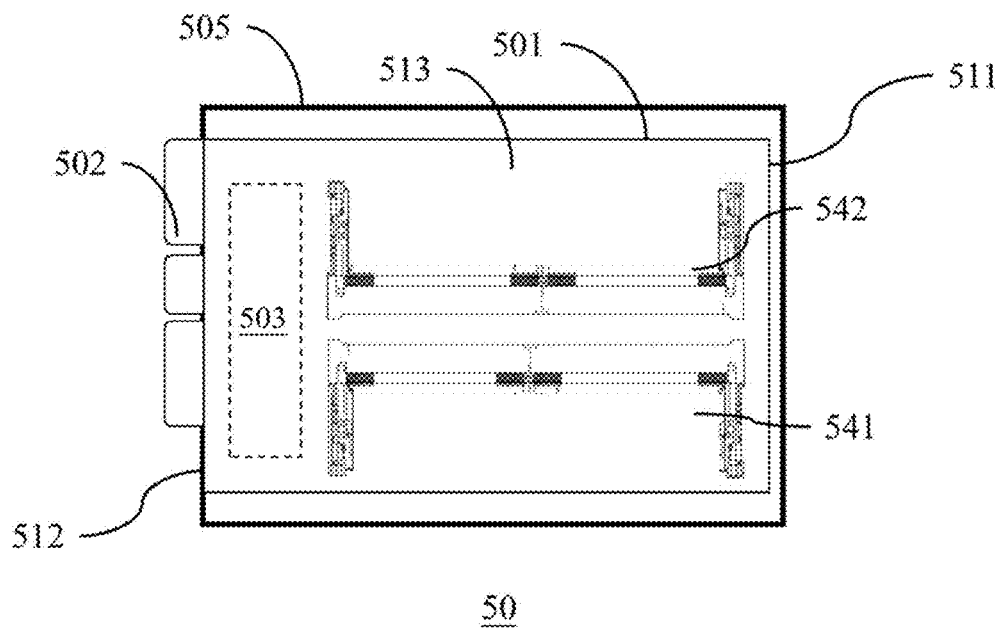
FIG. 5 shows a memory device 50 with a modular design according to an embodiment of the present application.
Figure 6:
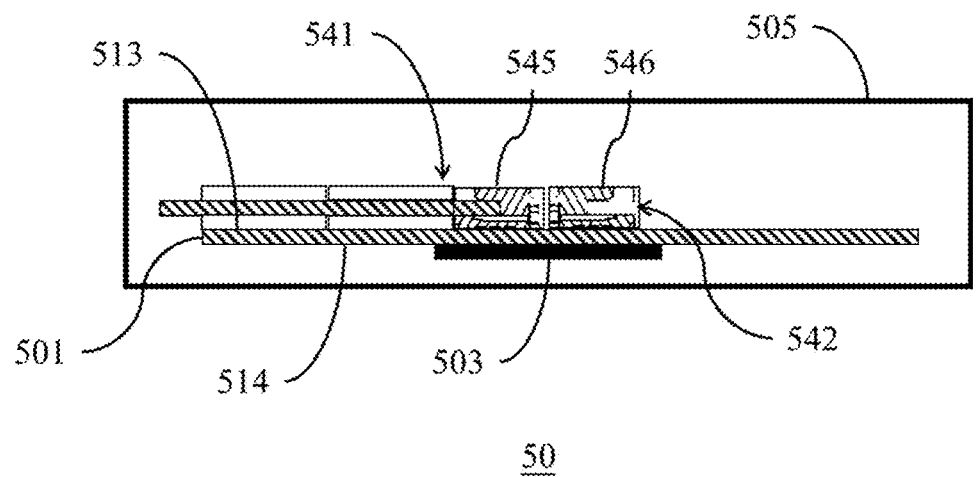
FIG. 6 shows a right view of the memory device 50 of FIG. 5.

FIG. 5 and FIG. 6 collaboratively show a memory device 50 with a modular design according to an embodiment of the present application. The memory device 50 includes a substrate plate 501 with a front edge 511, a rear edge 512, a top side 513, and a bottom side 514, which are similar to those components described with reference to FIGS. 1 and 2 and will therefore not be elaborated below.

In some embodiments, the substrate plate 501 and other electronic components or electronic functionalities mounted thereto can be enclosed by a chassis 505. The edge connector 502 of the memory device 50 is positioned at the rear edge 512 of the substrate plate 501 for an external device to be connected.

The memory device 50 includes a memory control module 503 which is positioned on the bottom side 514 of the substrate plate 501. In some embodiments, the memory control module 503 can be located in a spare region on the top side 513 between the edge connector 502 and the sockets 541, 542 for a compact design.

Compared with the memory device 10 shown in FIG. 1 and FIG. 2, two sockets 541, 542 are arranged on the substrate plate 501 in the same layer. Specifically, the first anchor 545 is adjacent to the second anchor 546 in a back-to-back manner, such that the first socket 541 can connect to and receive a first memory module in a first direction and the second socket 542 can connect to and receive a second memory module in a second direction. The second direction can be opposite to the first direction, which can be both aligned with a widthwise direction of the substrate plate 501, for example. In some embodiments, the first anchor 545, as well as the second anchor 546, can be positioned at a center of the top side 513 of the substrate plate 501. Accordingly, the first anchor 545 and the second anchor 546 are at the center, thus forming two regions of the same size for the memory modules. Compared with the memory device 10 shown in FIGS. 1 and 2 and the memory device 20 shown in FIGS. 3 and 4, the memory device 50 can accommodate memory modules with a standard height. This configuration is referred to as "butterfly layout" throughout this application. The first anchor 545 and the second anchor 546 are used for securing the first socket 541 and the second socket 542 to the top side 513 of the substrate plate 501, respectively.

Figure 7:
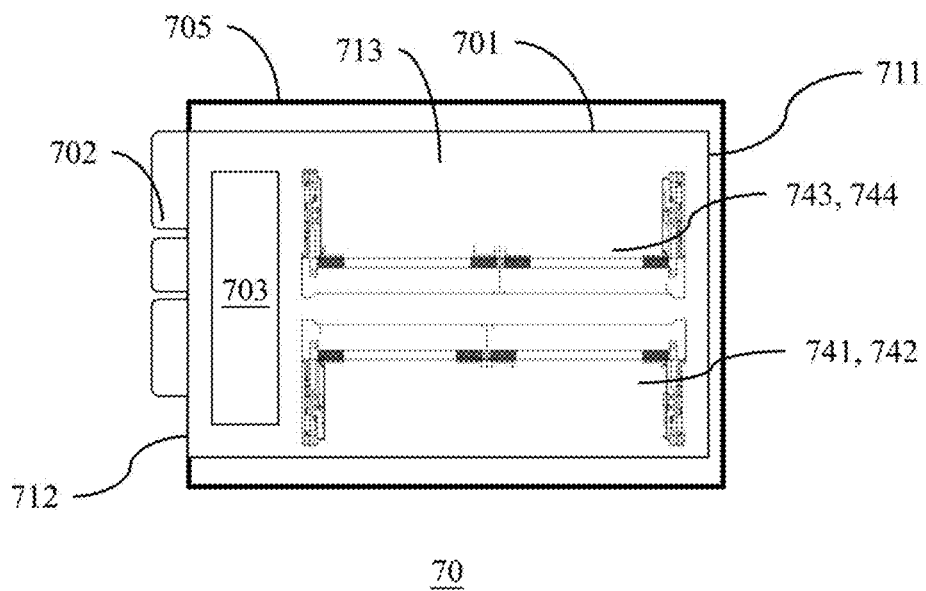
FIG. 7 shows a memory device 70 with a modular design according to an embodiment of the present application.
Figure 8:
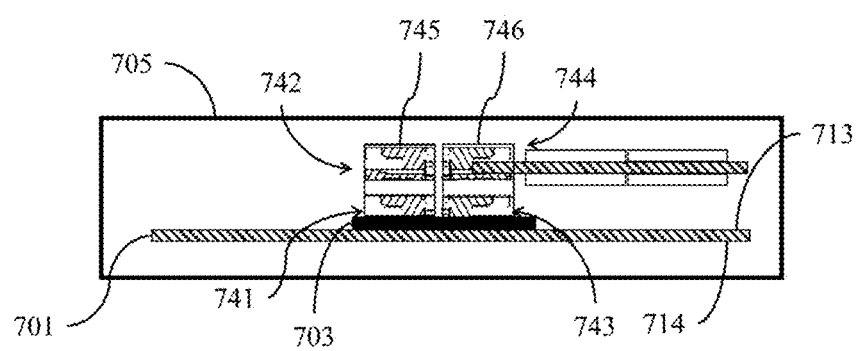
FIG. 8 shows a right view of the memory device 70 of FIG. 7.

FIG. 7 and FIG. 8 collaboratively show a memory device 70 with a modular design according to an embodiment of the present application. The memory device 70 includes a substrate plate 701 with a front edge 711, a rear edge 712, a top side 713, and a bottom side 714, which are similar to those components described with reference to FIGS. 1 and 2 and will therefore not be elaborated below.

Four sockets that are arranged in two layers are positioned on the substrate plate 701, which are twice the sockets of the memory device 50 shown in FIGS. 5 and 6. A memory control module 703 is positioned on the top side 713 of the substrate plate 701, between the edge connector 702 and the four sockets 741-744. In other embodiments, the memory control module 703 can be positioned on either of the top side 713 and the bottom side 714 of the substrate plate 701 provided that it does not conflict with the other components mounted on the substrate plate 701. It can be appreciated that the memory control module 703 may include an integrated circuit chip and optionally one or more other electrical components. Moreover, the arrangement of the memory control module 703 should not affect the memory modules to be accommodated. As such, the memory control module 703 can be located in the spare region between the edge connector 702 and the sockets 741-744.

The memory device 70 further includes a first anchor stack 745 for securing the first socket 741 and the second socket 742 to the top side 713 of the substrate plate 701, and a second anchor stack 746 for securing the third socket 743 and the fourth socket 744 to the top side 713 of the substrate plate 701. The first anchor stack 745 can be adjacent to the second anchor stack 746 such that the first and second sockets can be connected to two memory modules in a first direction and the third and fourth sockets can be connected to two potential memory modules in a second direction, which is opposite to the first direction.

When memory modules are connected to the respective sockets, those connected to the first and third sockets 741, 743 are closer to the top side 713 of the substrate plate 701 relative to the others connected the second and fourth sockets 742, 744. In other words, the first and third sockets 741, 743 can be positioned under the second and fourth sockets 742, 744, respectively. In some other examples, the first anchor stack 745 and the second anchor stack 746 can be integrally formed as a single piece for compact.

Figure 9:
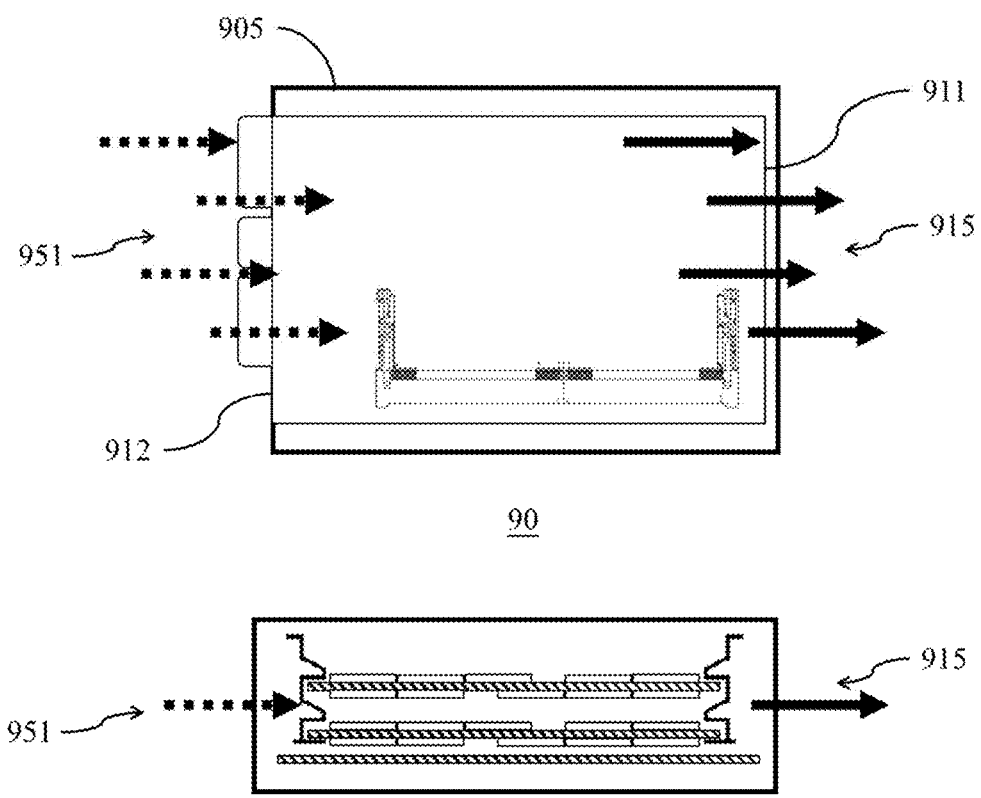
FIG. 9 shows a memory device 90 with a modular design and its front view according to an embodiment of the present application.

FIG. 9 shows a memory device 90 with a modular design according to an embodiment of the present application. The memory device 90 is shown in a planar view above and a corresponding sectional view below in FIG. 9. For the sake of brevity, some of the elements have been omitted. The chassis 905 of the memory device 90 may also has an air vent 915 at a front edge 911, and the air vent 915 is configured to build an air flow across the chassis 905 from an opening 951 to the air vent 915. In FIG. 9, cooling air (shown as dotted line) is introduced from the rear edge 912 into the chassis through the opening 951. The components inside may be cooled by the cooling air for heat dissipation, and the heated air can go out out of the chassis through the air vent 915. It can be appreciated that other configuration of air cooling or circulating system can be used in the memory device according to the embodiments of the present application.

Another embodiment of this application provides a memory system comprising any of the memory devices described above. The memory system may further comprise at least one memory module for removability connecting to the socket(s) of the memory devices. Such memory system provides a complete memory approach which may be commercially available to the end users.

According to some of the embodiments described above, the memory management in the memory device can be more flexible. It should be noted that although several modules or sub-modules of memory devices with a modular design according to embodiments of the present application are described in the above description, this division is merely exemplary rather than mandatory. In fact, according to the embodiments of the present application, features, and functions of two or more modules described above may be embodied in one module. Conversely, features and functions of one module described above can be further divided into a plurality of modules.

Those skilled in the art will be able to understand and implement other variations to the disclosed embodiments by studying the specification, the application, the drawings, and the appended claims. In the claims, the words "include" or "including" do not exclude other elements and steps, and the words "a" or "an" do not exclude the plural. In the practical application of the present application, one part may perform the functions of a plurality of technical features cited in the claims. Any reference numerals in the claims should not be construed as limiting the scope.

What is claimed is:

1. A memory device, comprising:
    a substrate plate having a front edge, a rear edge opposite to the front edge, and a top side and a bottom side which are opposite to each other and extend between the front edge and the rear edge;
    an edge connector positioned at the rear edge, positioned on a widthwise direction of the memory device, and configured to connect, in parallel with a lengthwise direction of the memory device, to a host connector of a host device;
    a memory control module positioned on one of the top side and the bottom side of the substrate plate;
    at least one socket positioned on the top side of the substrate plate and configured to connect to at least one removable memory module; and
    a chassis, in which the substrate plate, the memory control module and the at least one socket are enclosed, wherein the chassis comprises an opening through which the edge connector protrudes out of the chassis, and wherein the chassis further comprises an air vent at a front edge of the chassis and is configured to build an air flow across the chassis from the opening to the air vent;
    wherein the memory control module is electrically coupled to the edge connector and the at least one socket such that the at least one memory module can be accessible by the host device via the memory control module;
    wherein when the at least one memory module is connected to the at least one socket, a lengthwise direction of the at least one memory module is in parallel with the lengthwise direction of the memory device, the at least one memory module is inserted in the memory device in the widthwise direction of the memory device.

2. The memory device of claim 1, wherein the memory control module is positioned-on the bottom side of the substrate plate.

3. The memory device of claim 1, wherein the at least one socket comprises two sockets.

4. The memory device of claim 3, wherein the memory device further comprises:
    a first anchor for securing a first socket of the two sockets to the top side of the substrate plate; and
    a second anchor for securing a second socket of the two sockets to the top side of the substrate plate.

5. The memory device of claim 4, wherein the first socket is closer to the top side of the substrate plate relative to the second socket.

6. The memory device of claim 5, wherein the second socket is closer to a periphery of the substrate plate relative to the first socket.

7. The memory device of claim 4, wherein the first anchor and the second anchor are offset from each other in a planar direction of the top side of the substrate plate.

8. The memory device of claim 1, wherein the memory device further comprises:
    at least one retention clip for engaging with respective edges of the at least one memory module when they are connected to the at least one socket.

9. The memory device of claim 4, wherein the first anchor is adjacent to the second anchor such that the first socket connects to a first memory module of the at least one memory module in a first direction and the second socket connects to a second memory module of the at least one memory module in a second direction opposite to the first direction.

10. The memory device of claim 9, wherein the first anchor and the second anchor are positioned at a center of the top side of the substrate plate.

11. The memory device of claim 1, wherein the memory control module is positioned-on the top side of the substrate plate.

12. The memory device of claim 11, wherein the memory control module is positioned between the edge connector and the at least one socket.

13. The memory device of claim 12, wherein the memory device further comprises:
a first anchor for securing a first socket of the at least one socket to the top side of the substrate plate; and
a second anchor for securing a second socket of the at least one socket to the top side of the substrate plate.

14. The memory device of claim 13, wherein the first anchor is adjacent to the second anchor such that the first socket connects to a first memory module of the at least one memory module in a first direction and the second socket connects to a second memory module of the at least one memory module in a second direction opposite to the first direction.

15. The memory device of claim 1, wherein the memory device further comprises:
a first anchor stack for securing a first socket and a second socket of the at least one socket to the top side of the substrate plate; and
a second anchor stack for securing a third socket and a fourth socket of the at least one socket to the top side of the substrate plate.

16. The memory device of claim 15, wherein the first anchor stack is adjacent to the second anchor stack such that the first and second sockets connect to a first memory module and a second memory module of the at least one memory module in a first direction and the third and fourth sockets connect to a third memory module and a fourth memory module of the at least one memory module in a second direction opposite to the first direction.

17. The memory device of claim 16, wherein the first and third memory modules are closer to the top side of the substrate plate relative to the second and fourth memory modules when they are connected to the respective sockets.

18. The memory device of claim 15, wherein the first anchor stack and the second anchor stack are integrally formed as a single piece.

19. The memory device of claim 1, wherein the at least one memory module comprises at least one small outline dual inline memory module (SODIMM).

20. The memory device of claim 1, wherein the edge connector is in compliance with the SFF-TA-1002 standard.

21. A memory system, comprising the memory device of claim 1, and further comprising:
at least one removable memory module connected to the at least one socket, respectively.

* * * * *